United States Patent
Waagen et al.

(10) Patent No.: US 11,562,111 B1
(45) Date of Patent: Jan. 24, 2023

(54) PREDICTION SYSTEM FOR SIMULATING THE EFFECTS OF A REAL-WORLD EVENT

(71) Applicant: HRL Laboratories, LLC, Malibu, CA (US)

(72) Inventors: Alex N. Waagen, Agoura Hills, CA (US); Charles E. Martin, Santa Monica, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 593 days.

(21) Appl. No.: 16/596,224

(22) Filed: Oct. 8, 2019

Related U.S. Application Data

(60) Provisional application No. 62/754,293, filed on Nov. 1, 2018.

(51) Int. Cl.
  *G06F 30/20* (2020.01)
  *G06F 16/29* (2019.01)
  *G06K 9/62* (2022.01)
  *G06V 10/75* (2022.01)

(52) U.S. Cl.
  CPC .............. *G06F 30/20* (2020.01); *G06F 16/29* (2019.01); *G06K 9/623* (2013.01); *G06K 9/6251* (2013.01); *G06V 10/754* (2022.01)

(58) Field of Classification Search
  CPC ............ G06F 30/20; G06F 16/29; G08G 1/00
  See application file for complete search history.

(56) References Cited

U.S. PATENT DOCUMENTS

| | | | | |
|---|---|---|---|---|
| 2005/0251324 A1* | 11/2005 | Wiener | ............ | G08G 1/096811 701/414 |
| 2009/0043486 A1* | 2/2009 | Yang | .................. | G01C 21/3492 701/117 |
| 2010/0100510 A1* | 4/2010 | Balaban | .................... | G06N 7/08 706/14 |
| 2012/0095740 A1* | 4/2012 | Kitagawa | ............... | G06Q 10/04 703/6 |
| 2018/0076795 A1* | 3/2018 | Petre | ...................... | G06K 9/624 |
| 2018/0285699 A1* | 10/2018 | Kolouri | .................. | G06V 10/82 |

(Continued)

OTHER PUBLICATIONS

Ganin, Alexander A., et al. "Resilience and efficiency in transportation networks." Science advances 3.12 (2017) e1701079, pp. 1-9.

(Continued)

*Primary Examiner* — Yi Yang
(74) *Attorney, Agent, or Firm* — Tope-McKay & Associates

(57) ABSTRACT

A prediction system for simulating effects of a real-world event can be used for autonomous driving. In operation, the system receives input data regarding a complex system (e.g., roadways) and various real-world events. A full-scale network is constructed of the complex system, such that nodes represent road intersections and edges between nodes represent road segments linking the road intersections. The network is reduced is scaled down to generate a multi-layer model of the complex system. Each layer in the model is simulated to identify equilibrium flows, with the model thereafter destabilized by applying stimuli to reflect the real-world event. An autonomous vehicle can then be caused to chart and traverse a road path based on road segments and intersections that are least affected by the real-world event.

27 Claims, 11 Drawing Sheets

(56) References Cited

U.S. PATENT DOCUMENTS

| | | | |
|---|---|---|---|
| 2019/0019409 A1* | 1/2019 | Farr | G08G 1/09626 |
| 2019/0287391 A1* | 9/2019 | Ozawa | G06Q 10/047 |
| 2019/0301891 A1* | 10/2019 | Rowitch | G01C 21/3697 |

OTHER PUBLICATIONS

Battaglia, P. W., Pascanu, R., Lai, M., Rezende, D., & Kavukcuoglu, K. (2016). Interaction Networks for Learning about Objects, Relations and Physics, NIPS '16, pp. 4509-4517.

Peng, X. Bin, Berseth, G., Yin, K., & Panne, M. van de. (2017). DeepLoco: Dynamic Locomotion Skills Using Hierarchical Deep Reinforcement Learning. ACM Transactions on Graphics, 36(4), pp. 41:1-41:13.

Grzeszczuk, R., Terzopoulos, D., & Hinton, G. (1998). NeuroAnimator. Proceedings of the 25th Annual Conference on Computer Graphics and Interactive Techniques—SIGGRAPH '98, pp. 9-20.

2009 National Household Travel Survey (U.S. Department of Transportation, Federal Highway Administration, 2009); pp. 1-83.

Karduni,A., Kermanshah, A., and Derrible, S., 2016, "A protocol to convert spatial polyline data to network formats and applications to world urban road networks", Scientific Data, 3:160046, pp. 1-7.

\* cited by examiner

| Ranking | Average Traffic Load | Average Time Lost | Average Discontent |
|---|---|---|---|
| 1 | 187457 | 4107 | 0.02 |
| 2 | 272989 | 5011 | 0.02 |
| 3 | 275610 | 5142 | 0.02 |
| 4 | 275772 | 5217 | 0.02 |
| 5 | 276061 | 5217 | 0.02 |
| 6 | 276332 | 5223 | 0.02 |
| 7 | 276347 | 5222 | 0.02 |
| 8 | 276351 | 5224 | 0.02 |
| 9 | 276432 | 5224 | 0.02 |
| 10 | 276450 | 5226 | 0.02 |

FIG. 9

| Ranking | Average Traffic Load | Average Time Lost | Average Discontent |
|---|---|---|---|
| 1131 | 297151 | 7309 | 3.0 |
| 1132 | 297166 | 7310 | 3.4 |
| 1133 | 297182 | 7311 | 3.8 |
| 1134 | 297220 | 7325 | 4.2 |
| 1135 | 297232 | 7329 | 4.9 |
| 1136 | 297244 | 7340 | 5.9 |
| 1137 | 297246 | 7378 | 7.3 |
| 1138 | 297516 | 737 | 9.8 |
| 1139 | 297559 | 7463 | 15.6 |
| 1140 | 298511 | 7518 | 27.8 |

FIG. 10

PREDICTION SYSTEM FOR SIMULATING THE EFFECTS OF A REAL-WORLD EVENT

CROSS-REFERENCE TO RELATED APPLICATIONS

This application claims the benefit of and is a non-provisional patent application of U.S. Provisional Application No. 62/754,293, filed on Nov. 1, 2018, the entirety of which is hereby incorporated by reference.

BACKGROUND OF INVENTION

(1) Field of Invention

The present invention relates to a prediction system and, more specifically, to a system and method for building and simulating multi-scale and multi-layer interacting flows in a complex system and for predicting responses to targeted stimuli on the components of the complex system.

(2) Description of Related Art

Researchers have attempted to design a variety of models to predict a response to a targeted stimulus. State-of-the-art approaches in this area tend to be focused on single layer models that capture the dynamics of a single, isolated system, such as predicting the outcomes of physical interactions between objects such as billiard balls (see the List of Incorporated Literature References, Literature Reference No. 2). Current approaches typically do not create models that capture dynamics on multiple scales. For an exception, see the work of Peng et al., where a low-level neural controller was trained to emulate various walking gates (30 Hz time-scale) and a second, high-level neural controller was trained to interact with the low-level controller to emulate behaviors (2 Hz time-scale), such as path following (see Literature Reference No. 3). A problem with the work of Peng et al. is that although the descripted process captures multiple scales, it is still focused on a single layer rather than multiple interacting layers. The process of Peng et al. is also specialized to locomotion and cannot be easily generalized to a wide range of different dynamics.

Thus, a continuing need exists for a system operable for predicting changes in complex system dynamics which include multiple layers from different domains, and simulating the effects of specific user-specified stimuli in such a complex system.

SUMMARY OF INVENTION

The present disclosure provides a prediction system for simulating effects of a real-world event. In various aspects, the system includes one or more processors and a memory. The memory is a non-transitory computer-readable medium having executable instructions encoded thereon, such that upon execution of the instructions, the one or more processors perform several operations, such as receiving input data regarding a complex system, the input data having at least a first parameter, a second parameter, and stimuli specifications; constructing a full-scale network of the complex system based on the first parameter, such that nodes represent intersecting similarities between components in the first parameter and edges linking the nodes represent distances between nodes; generating a reduced network by merging nodes whose locations are within a predefined shape; scaling-down the reduced network by clustering the nodes based on location and merging all nodes in a same cluster; generating a multi-layer model of the complex system through setting node features by associating the second parameter to each node; simulating each layer in the multi-layer model to identify equilibrium flows of the multi-layer model; applying stimuli to the multi-layer model to destabilize the multi-layer model, the stimuli reflecting at least one real-world event as associated with the complex system; and generating a list of stimuli reflecting a ranking of effected edges between nodes and associated changes in flow in response to each applied stimuli.

In yet another aspect, the system performs an operation of causing a device to implement an action based on occurrence of the real-world event.

Further, the action is based on the list of stimuli to cause the device to operate according to edges least affected in response to the stimuli associated with the real-world event.

In another aspect, the complex system includes roadways within a city and the first parameter includes road data and the second parameter includes population data.

Additionally, nodes in the full-scale network represent road intersections and edges between nodes represent road segments linking the road intersections.

In another aspect, causing a device to implement an action based on occurrence of the real-world event includes causing an autonomous vehicle to chart and traverse a road path based on road segments and intersections that are least affected by the real-world event.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where:

FIG. 9 is a table depicting average traffic time and average time lost due to removing the best ten selections of three roads in Los Angeles county;

FIG. 10 is a table depicting average traffic time and average time lost due to removing the worst ten selections of three roads in Los Angeles county.

DETAILED DESCRIPTION

Figure 1:
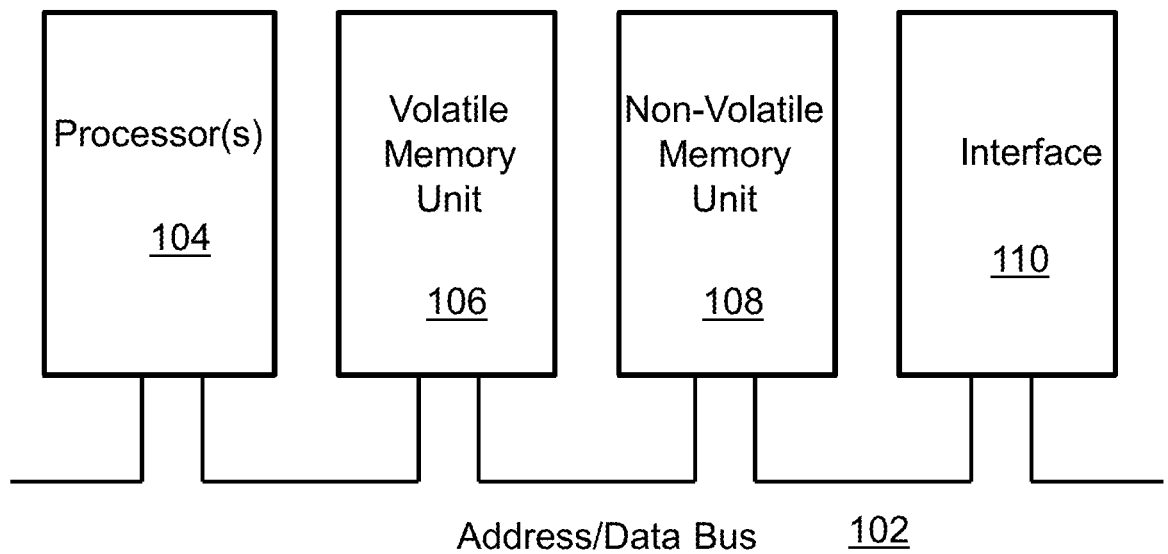
FIG. 1 is a block diagram depicting the components of a system according to various embodiments of the present invention.
Figure 1:
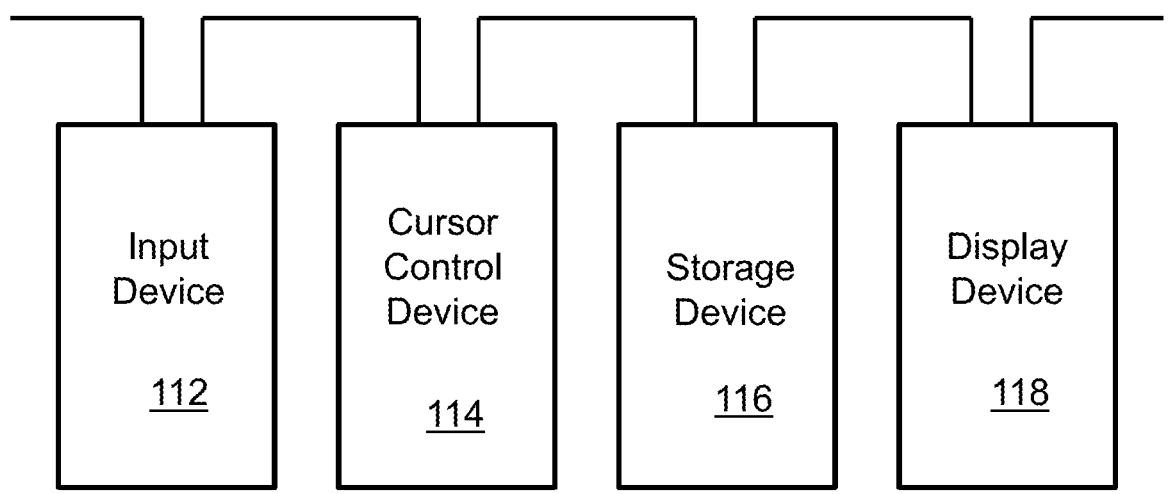

The present invention relates to a prediction system and, more specifically, to a system and method for building and simulating multi-scale and multi-layer interacting flows in a complex system and for predicting a response to targeted stimuli on the components of the complex system. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a list of cited references is provided. Next, a description of the various principal aspects of the present invention is provided. Subsequently, an introduction provides the reader with a general understanding of the present invention. Finally, specific details of various embodiment of the present invention are provided to give an understanding of the specific aspects.

(1) LIST OF INCORPORATED LITERATURE REFERENCES

The following references are cited throughout this application. For clarity and convenience, the references are listed herein as a central resource for the reader. The following references are hereby incorporated by reference as though fully set forth herein. The references are cited in the application by referring to the corresponding literature reference number, as follows:

1. Ganin, Alexander A., et al. "Resilience and efficiency in transportation networks." Science advances 3.12 (2017): e1701079.
2. Battaglia, P. W., Pascanu, R., Lai, M., Rezende, D., & Kavukcuoglu, K. (2016). Interaction Networks for Learning about Objects, Relations and Physics, NIPS '16, pp. 4509-4517.
3. Peng, X. Bin, Berseth, G., Yin, K., & Panne, M. van de. (2017). DeepLoco: Dynamic Locomotion Skills Using Hierarchical Deep Reinforcement Learning. ACM Transactions on Graphics, 36(4), 41:1-41:13. http://doi.org/10.1145/3072959.3073602
4. Grzeszczuk, R., Terzopoulos, D., & Hinton, G. (1998). NeuroAnimator. Proceedings of the 25th Annual Conference on Computer Graphics and Interactive Techniques—SIGGRAPH '98, 9-20. http://doi.org/10.1145/280814.280816
5. 2009 National Household Travel Survey (U.S. Department of Transportation, Federal Highway Administration, 2009); http://nhts.ornl.gov.
6. 2012 Cartographic Boundary File, 2010 Census Urban Area for United States, 1:500,000 (U.S. Census Bureau, 2012); www2.census.gov/geo/tiger/TIGER2010/UA/2010/tl_2010_us_uac10.zip.
7. 2010 Census Data (U.S. Census Bureau, 2010); ftp://ftp2.census.gov/geo/tiger/TIGER2010DP1/Tract_2010Census_DP1.zip
8. Karduni, A., Kermanshah, A., and Derrible, S., 2016, "A protocol to convert spatial polyline data to network formats and applications to world urban road networks", Scientific Data, 3:160046

(2) PRINCIPAL ASPECTS

Various embodiments of the invention include three "principal" aspects. The first is a prediction system. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
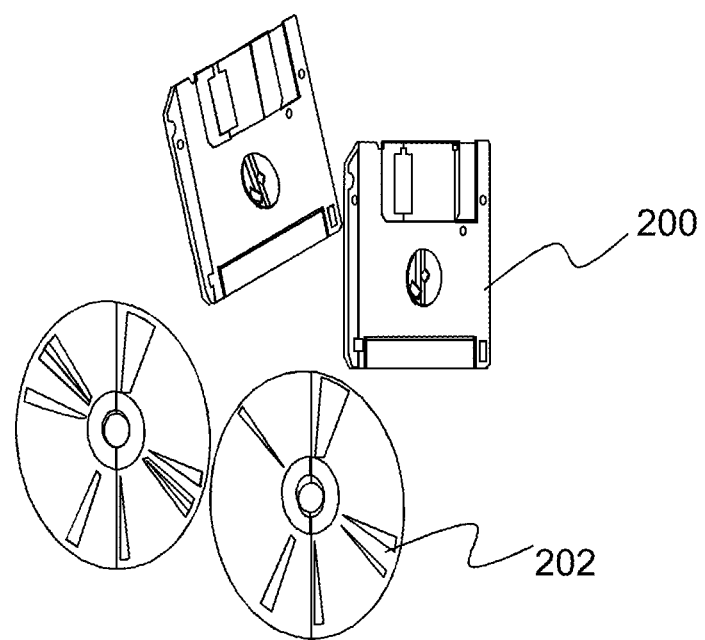
FIG. 2 is an illustration of a computer program product embodying an aspect of the present invention.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(3) INTRODUCTION

The present disclosure provides a unique system and methodology for building and simulating multi-scale and multi-layer interacting flows in urban environments and predicting the responses to targeted stimuli on the components of the system/model. The system implements a model based on aggregate flows between locations, and it incorporates vehicle flows, revenue flows, and discontent flows, that allow the system to predict the response of an urban system to abrupt changes in such flows.

In order to effectively provide such a prediction, the system includes interacting multi-layer dynamics algorithms that incorporate multiple diverse flows spanning domains in a complex system (communication flows, cash flows, transportation flows). Also included are the presence of targeted stimuli (e.g., from adversaries or city planners) who target multiple roads which facilitate the heaviest flow of traffic. With such an algorithm, the system is able to predict changes in the system in response to such targeted attacks, as well as scale the system/model to allow the end-user to trade-off accuracy/precision for computational efficiency.

As noted above, the system and method of the present disclosure can predict the response of complex flow dynamics in systems which incorporate layers with diverse dynamics spanning multiple domains when specific flows are altered, either due to adversarial attacks, scheduled repairs, or exogenous events. Several advantages provided by the system described herein include being flexible to a wide variety of scenarios (layers may represent different urban flows such as cash, electricity, and traffic); being able to incorporate multiple, interacting layers; and supporting multiple resolution scales.

The present method and system for predicting the response of an urban system to abrupt changes in flow could be extended to a wide variety of models. By way of example, the disclosed invention can be used to create a database which allows end users to analyze and visualize the response of the system to various stimuli via a user interface, such as roads being shut down or slowed due to construction, or even blocked as a result of improvised explosives. Stimuli could also represent additions to the system, such as new road segments and intersections or an influx of population/revenue. This can be used as a tool in city planning or in military applications to identify vulnerabilities in a system that should be guarded against, such as roads that should be secured against attack to minimize the potential systemic damage. Further details regarding the system and example implementations are provided below.

(4) SPECIFIC DETAILS OF VARIOUS EMBODIMENTS

As noted above, the present disclosure is directed to a system and method for building and simulating multi-scale and multi-layer interacting flows in a complex system and for predicting responses to targeted stimuli on the components of the complex system. For illustrative purposes, the system was implemented with respect to the road architecture in Los Angeles county. Thus, although the system is described below with respect to roads (and in particular, the roads in Los Angeles county), it should be understood that the invention is not intended to be limited thereto as it can be implemented in any complex system having multi-layer interacting flows. In the example provided, three different flows moving over this road architecture represent aggregate activity of individual agents: cash flow, discontent flow, and traffic flow. These flows are referenced as occurring on different "layers" of the network for convenience: the revenue layer, the social layer, and the traffic layer. These dynamics flow across layers, with the traffic layer affecting both the revenue and social layer, and the revenue layer affecting the social layer. This model captures changes occurring on a relatively short time scale in which population and spending rates remain relatively fixed.

(4.1) System Operation

Figure 3:
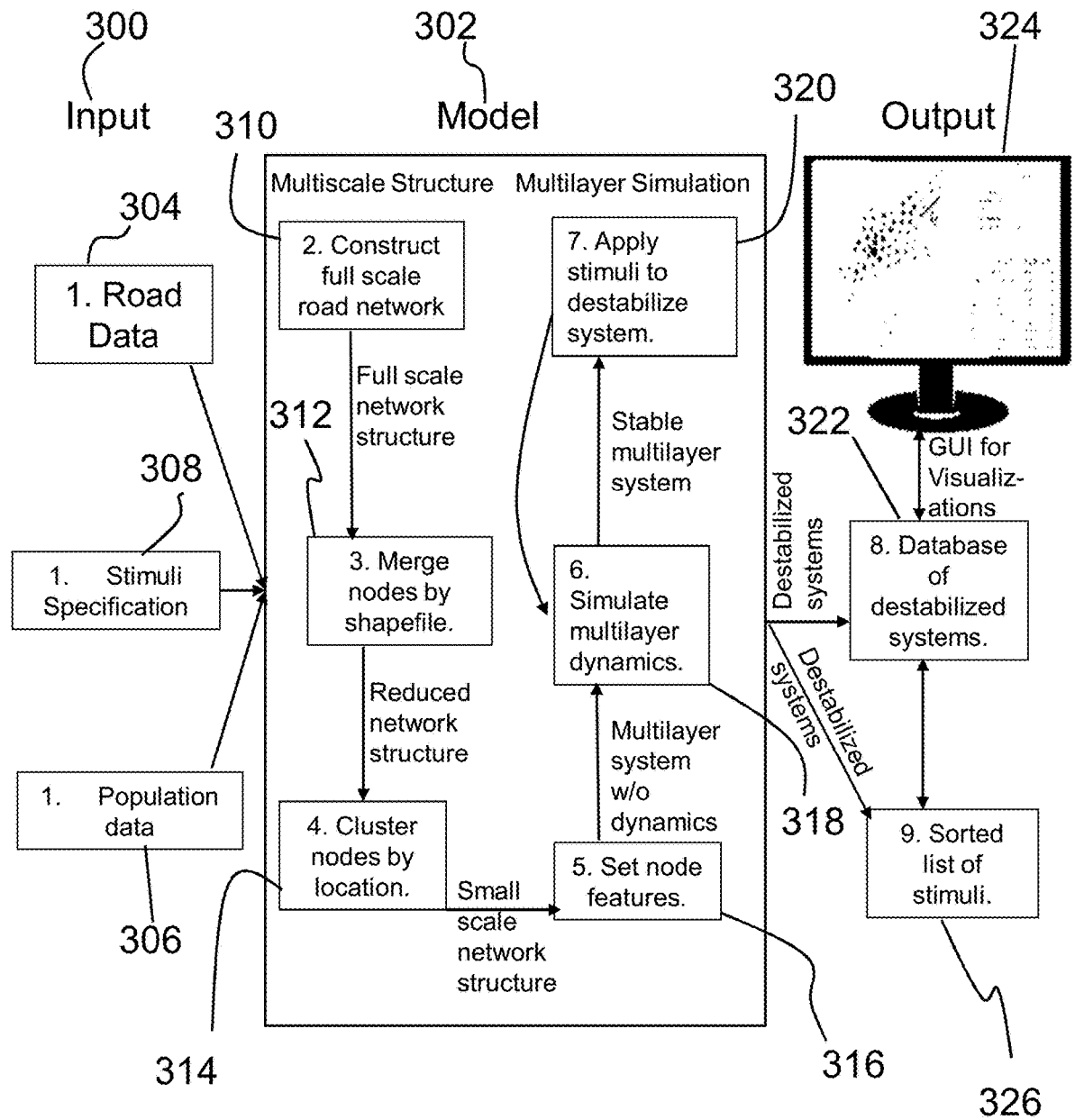
FIG. 3 is a flowchart illustrating process flow for a prediction system according to various embodiments of the present invention.

As shown in FIG. 3, input 300 is first required to build the multi-layer model 302 representing a complex system. The complex system is a distributed combination of many (often locally) interacting components that often exhibit self-organizing and emergent behaviors, a non-limiting example of which includes roadways in a particular city, town, etc. One example of a complex system is the "Urban Agglomeration", which consists of a multitude of interacting systems that consist of many distributed components, such as the transportation, economic, power-distribution, and social systems within a city, such as Los Angeles. In this example, the input 300 includes road data 304, population data 306, and stimuli specifications 308. The road data 304 includes intersections labeled with location coordinates along with road segments linked by the intersections, each road segment having a length and number of lanes. The population data 306 includes shapefiles indicating geographic regions along with the corresponding population counts. If this data is not publicly available, it must be provided by the end user. A specification of stimuli 308 may also be given as input (e.g., the user may want to know the effects of blocking one road at a time or multiple roads).

After designating the input 300, a full-scale network from the road data is constructed 310, with nodes representing intersections and road segments linking them. Thereafter, a reduced network is built 312 by merging the set of nodes whose locations are inside the boundaries of a shapefile, associating an accurate population count to each node after the merging is complete. The network is then scaled-down 314 applying k-means clustering to the set of node locations (e.g., latitudes and longitudes) and merging all nodes in the same cluster. Node features are then set 316 by associating a population and spending rate to each node. The resultant system is the multi-layer model without flows.

Once the multi-layer model is generated, the multi-layer dynamics are simulated 318 (as described in Section 4.3 below) to find the equilibrium flows on the multi-layer model (e.g., the multi-layer model is the representation of the Urban Agglomeration). This describes the way the multi-layer model functions in a stable state absent any stimulus. Thus, a list of stimuli is successively applied 320 to the multi-layer model. This list of stimuli is internal to the model and defined to fit the particular application to destabilize the multi-layer model.

The stimuli and associated destabilized flows along each edge resulting from the process listed above is saved or otherwise written to a database of destabilized systems 322 that can be queried as needed. In operation, an end user can query 324 the system, such as using a graphical user interface (GUI) to select a stimulus action. Thus, in this example, the GUI queries the dictionary 322 based on the user input to output a visualization and a table listing the most highly effected links and their associated changes in flow in response to the selected stimulus action. A .csv file or list 326 can also be sent to the end user, sorted by most important to least important stimuli. These steps as listed above are described in further detail below.

(4.2) Multiscale Model

This section corresponds to the multiscale structure generation processes, depicted as elements 310, 312, and 314 of FIG. 3. As noted above, the input road 304 and census data 306 is used to build a small-scale model of a road network with population values and location coordinates assigned to each node.

Figure 4:
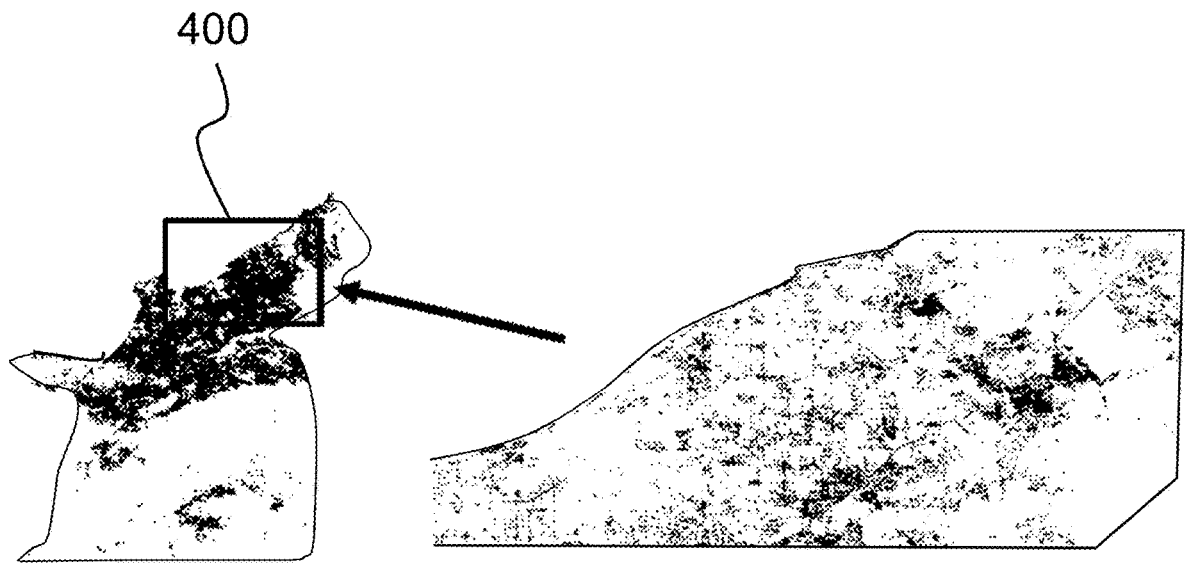
FIG. 4 is an illustration of a full-scale road network for Los Angeles county with nodes sized proportionally to population counts.
Figures 5A, 5B, 5C:
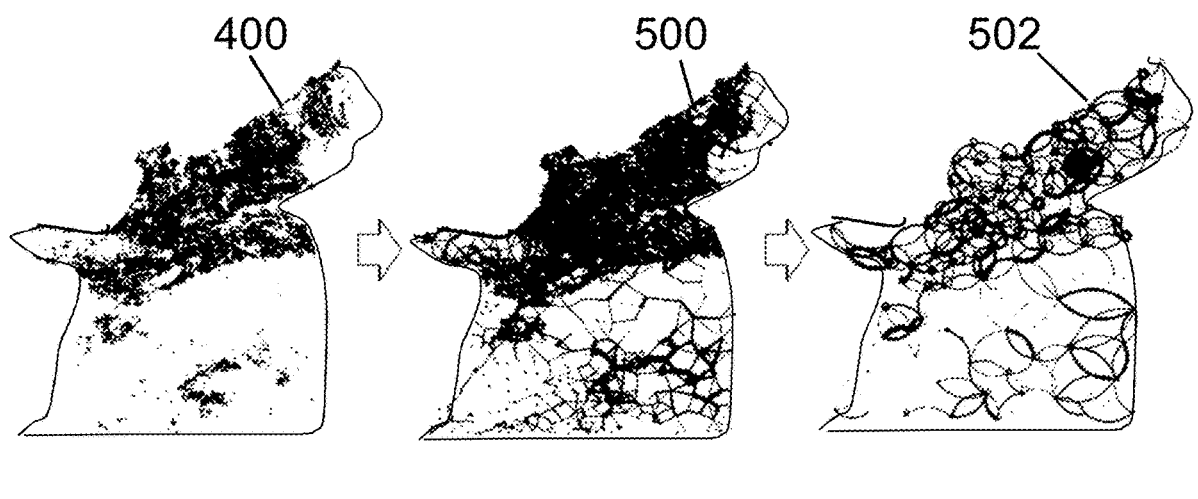
FIG. 5A is an illustration of a full-scale road network for Los Angeles county.
FIG. 5B is an illustration of a reduced road network for Los Angeles county.
FIG. 5C is an illustration of a clustered road network for Los Angeles county.

As shown in FIGS. 4 and 5A, in the full-scale road network representation 400, nodes are intersections of road segments whose locations are described by latitude and longitude coordinates. Edges between nodes represent road segments with an associated length in meters and number of lanes determined by multiplicity in the original data source. Census data is used (see Literature Reference Nos. 6 and 7) to associate a population to each node. Note that many nearby nodes may have the same population, because the population is determined by census tracts which will include many different road intersections.

The reduced road network 500 is depicted in FIG. 5B. In order to achieve consistency in representation of population and accurately represent aggregate activity, all nodes are merged together which lie in the same census tract as determined by shapefiles included with the census data. To merge a set of nodes S, all nodes in S are replaced with a single node whose links are to be comprised of union of the links of each node in S. Thus, the reduced road network 500 is generated by iterating over all census tracts and merging all the nodes included in each one. In this context, "one" refers to a census tract, such that the process is combining all nodes (and edges) within a census tract.

The clustered road network 502 is depicted in FIG. 5C. To further simplify the road network, K-means clustering is applied on the averaged latitude-longitude coordinates of the nodes in the reduced road network 500. Finally, the system merges all nodes in each resulting cluster to form the resulting clustered road network 502.

(4.3) Simulation of Multi-Layer Dynamics

Figure 6A:
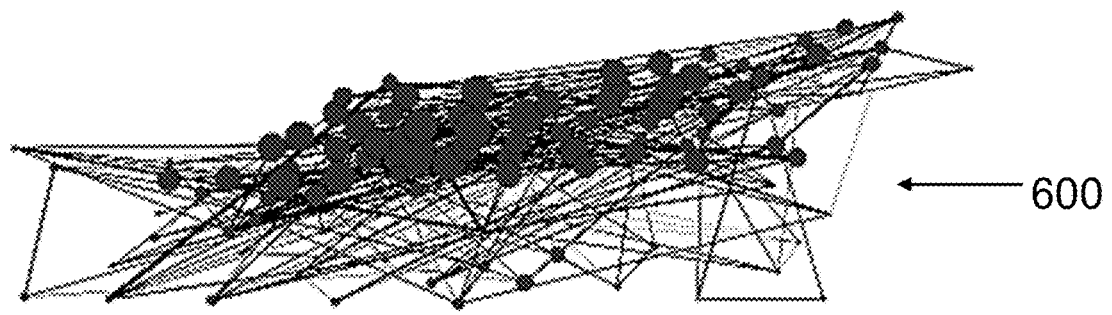
FIG. 6A is an illustration of a scaled-down multi-layer network with layers for discontent, with nodes sized proportionally to a total amount of incoming flow.
Figure 6B:
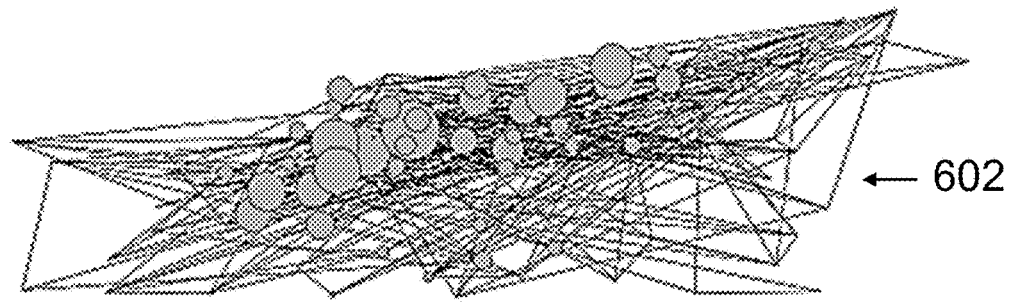
FIG. 6B is an illustration of a scaled-down multi-layer network with layers for traffic, with nodes sized proportionally to a total amount of incoming flow.
Figure 6C:
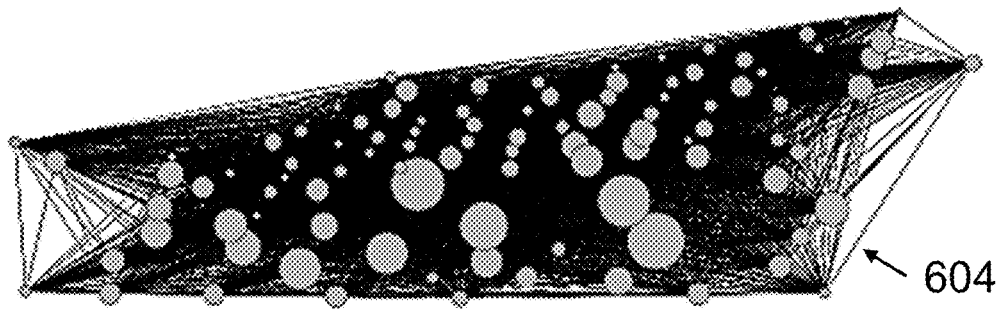
FIG. 6C is an illustration of a scaled-down multi-layer network with layers for revenue, with nodes sized proportionally to a total amount of incoming flow.

This section corresponds to the system operation steps, depicted as elements 316 and 318 of FIG. 3, in which the system simulates multi-layer dynamics on top of the road network described in the previous section. As shown in FIGS. 6A, 6B, and 6C, there are three disparate layers: social discontent 600, traffic 602, and revenue 604.

The traffic flow is first described for further understanding. The traffic flow layer 602 is based on a traffic model which calculates traffic load, traffic speed, and estimates time lost due to traffic flow in daily commutes (for a non-limiting example, see Literature Reference No. 1). It is assumed that agents follow the quickest path to reach their destination based on free flow traffic.

The system first calculates the traffic load $L_{ij}$ on each edge, which is the number of vehicles which travel along each road segment at some point throughout their trip. In the equation below, $N_d$ is the population at node d, $f_{od} \sim Pr(k)N_d$ approximates the portion of vehicles starting at o that commute to d, $F_{od} = N_o f_{od}$ approximates the number of vehicles traveling from o to d, and $Pr(k)$ is the empirical probability of that a randomly sampled trip is of length k km, based on survey data (such as that found in Literature Reference No. 5).

$L_{ij} = \Sigma_{o,d}$ Fod $l_{od}(i,j)$ is the commuter load on road (i,j) with $l_{od}(i,j)=1$ if (i,j) is on the shortest path from o to d and $l_{od}(i,j)=0$ otherwise.

Next, the system identifies the traffic speed $v_{ij}$, the speed at which traffic flows along a road in rush hour traffic. In the equation below, $m_{ij}$ is the number of lanes on road (i,j), $r_{ij}$ is a parameter adjusting for the average size of vehicles, and $\alpha$ is the proportionality coefficient (for example, see [1]).

$$v_{ij} = \min(\{ar_{ij}m_{ij}/L_{ij} - v_{veh}\})$$

Finally, the system finds the cumulative time lost $\Delta T$, which is the total time lost due to traffic. This measures the efficiency of the road network and also determines effects on the discontent layer. In the equation below, $l_0$ is the length correction due to traffic signals, and $V_{ij}$ is the free flow traffic speed.

$$\Delta T = \beta \Sigma_{i,j} L_{i,j}[(l_{ij}+l_0)/v_{ij}+(l_{ij}+l_0)/V_{ij}]$$

In one aspect, the cumulative time lost is not directly shown in traffic layer 602, in which edge thickness is the commuter load $L_{ij}$ and the node size is relative to sum of the commuter load over all edges. Further, in one aspect, the revenue layer 604 is based on cash flow. Cash flow in this aspect is determined by a spending rate c(o) from each origin which is based on population, under the assumption that the spending rate as dependent on population has a normal distribution and is maximized around suburban populations. The total revenue Revenue$_d$ flowing into node d is given below along with the total revenue lost due to traffic, CIL$_o$(t). In the equation below FFS_Revenue refers to the revenue in the case in which no time is lost to traffic.

$$\text{Revenue}_d = \text{Rate}_d \Sigma_o c(o) F_{od}/N_{\to d}$$

$$CIL_o(t) = \Sigma(FFS\_Revenue_d(t) - Revenue_d(t))F_{od}(t)/\Sigma_{o'}F_{o'}(t))$$

$$\text{Rate}_d = \Sigma_{ij} v_{ij}/(r_{ij}+r0)$$

$$N_{\to d} = \Sigma_o F_{od}$$

$N_{\to d}$ approximates the number of vehicles traveling to a destination d, so this does not show up directly in the revenue layer 604. The nodes in the revenue layer 604 are sized relative to the money spent at each node, which is Revenue$_d$. This is over all possible sources and destinations. The edges in the revenue layer 604 each represent a given source and destination, and thickness of each edge is relative to c(o)F$_{od}$.

The social discontent layer 600 is reflective of a discontent flow. Discontent is determined by time and income lost due to traffic, and flows to nearby neighbors via a simple spreading process. In the equations below, $\tau > 0$ is a time constant, $L > 0$ is the leak rate, $\gamma$ is the contribution of time loss to discontent, $\lambda$ is the contribution of income loss to discontent, and $\delta$ is the decay rate at which discontent decays as it spreads to neighbors.

$$d_o(t+1) = d_o(t)(1-\tau L) + \tau I_o(t) \text{ is the discontent at } o.$$

$$w_{od} \sim N_d$$

$$I_o(t) = \gamma \Delta T + \lambda CIL_o + \delta \Sigma_x w_{xo} d_x(t)$$

In the discontent layers 600, nodes are sized relative to $d_o$. The edges represent the number of roads between locations, as in the clustered road network 502.

(4.4) Response to Stimuli

This section corresponds to stimulation step of system operation, depicted as element 320 of FIG. 3, in which stimulus is applied to temporarily destabilize flows on the system. The system of the present disclosure can predict the response of any such stimulus which can be formulated as a change in flows and/or system features. The user specifies a list of stimuli as input, which may for example simply be a list of all edges, each of which could be attacked and shut down for a fixed period of time. Or it may be a list of all pairs of edges which could be attacked simultaneously, or a list of all potential edges in the network that could be added to reduce traffic. The method iterates over each individual stimulus, first applying it to the complex system and then storing the effects over time until equilibrium or a predefined stopping point is reached. As a non-limiting example, the equilibrium is reached when the maximal change in flow is below a user-specified threshold (10^-5) along any individual edge and in any of the three layers.

The stimulus can take many forms in the context of real-world scenarios. For example, the stimulus could be an attack that causes significant structural damage and makes a road unusable for a significant time, or causes little to no damage and halts or slows traffic temporarily. As another example, entire roads or individual lanes closed for construction. Other examples include new roads being built to reduce traffic, or an increase or decrease in population/revenue/discontent.

(4.5) Example Applications

The method and system of the present disclosure can be applied practically as a planning tool in a variety of scenarios. Provided below are several non-limiting example scenarios to assist the reader in understanding various applications and implementations of present invention.

(4.5.1) Example Scenario One

The first example scenario is one in which a city government has an allocated amount of money to spend on road improvements. Each possible spending allocation which adds additional road segments or increases the number of lanes in certain roads, can be represented as a potential stimulus to the model. The user-supplied list of stimuli can then be used to build a table which represents the effects. The effects may be sorted, for example, by the aggregated discontent over all nodes in ascending order. The proposed changes at the top of this sorted list are then selected at the most desirable options in terms of reducing discontent, or alternatively increasing the level of happiness in the populace. The end user can then use the GUI to see a visualization of the specific effects of each of the proposed changes to select the most suitable.

(4.5.2) Example Scenario Two

Another example scenario is where some specified number of roads are in poor condition and need to be repaired. It is desirable to simultaneously repair as many roads as possible to reduce costs, with a limit on the maximal amount of acceptable time lost due to increased traffic. If there are 10 roads that need to be repaired, the number of possible stimuli is the number of combinations of different subsets of the 10 roads, which is 10+45+120+210+252+210+120+45+ 10+1=1023. As before, the system individually simulates the result of each stimulus and stores the results in a table. In this example, the proposed combinations are also sorted by the aggregated time lost due to traffic over all roads. The planners then know which combinations of simultaneous repairs must be avoided, and can select the largest combinations which do not result in undue loss of time to traffic.

(4.5.3) Example Scenario Three

Figure 7:
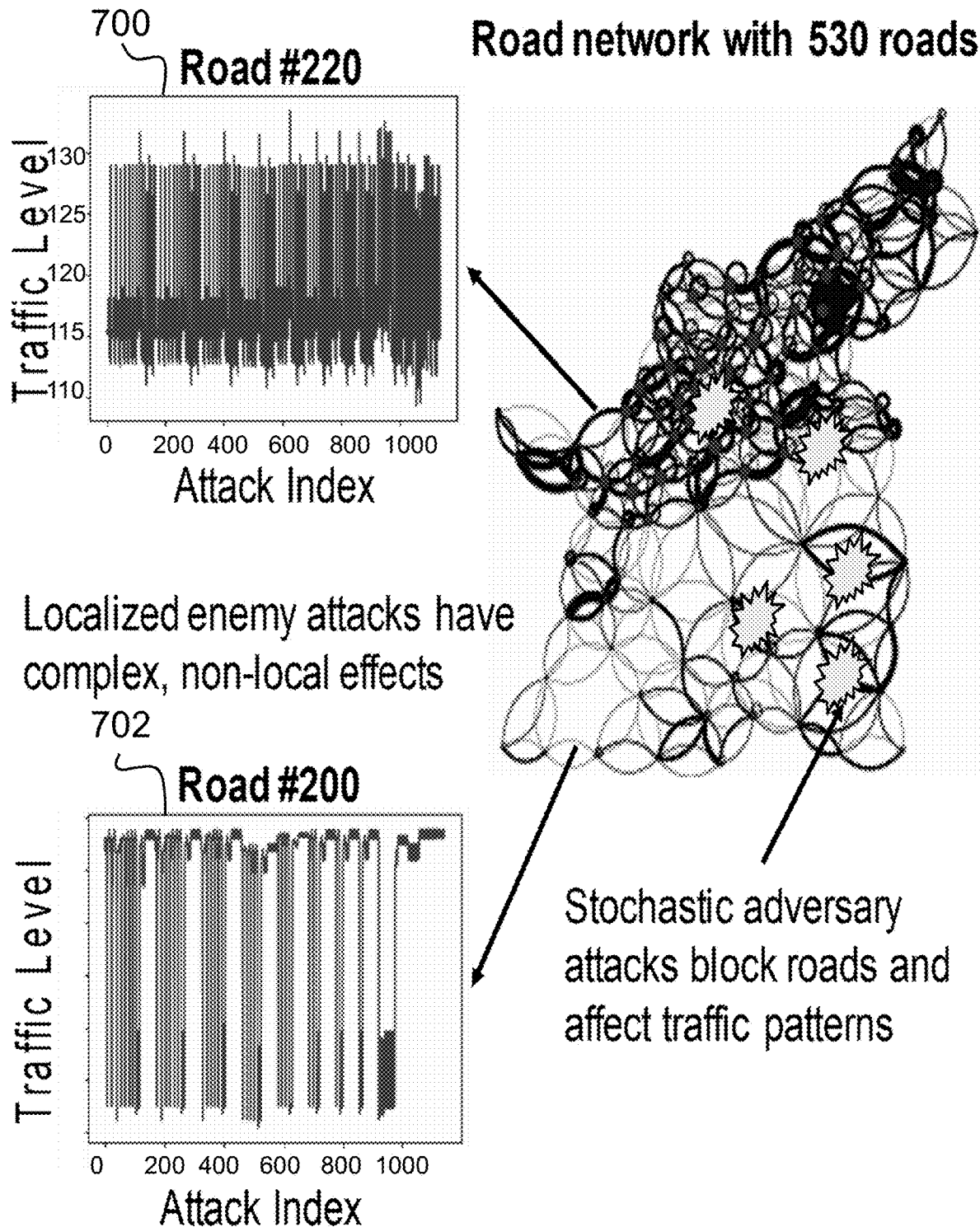
FIG. 7 is an illustration depicting effects on traffic of attacks on the Los Angeles county road network as predicted by the prediction system according to various embodiments of the present invention.

Another example scenario includes a situation where there is a conflict between the U.S. military and insurgents in a region (e.g., a region of Afghanistan), and the U.S. military wishes to supply villages, towns, and cities in that region. In this case the "revenue" layer represents the flow of supplies rather than money, and the traffic layer is likely less consequential due to the low number of vehicles on the roads. People are not likely to lose time due to traffic, but will become discontented due to lack of supplies, and may join the insurgents as a result. Supposing that some number of roads can be placed under watch in order to ensure they remain functional, the list of all possible stimuli could consist of all combinations of five different roads, sorted by the amount of discontent produced as a result of an attack. The end user can then use the GUI to visualize the effects of guarding proposed combinations of five roads. For further understanding, FIG. 7 provides an illustration depicting effects on traffic attacks on the Los Angeles road network as predicted by the present invention (i.e., an adversary was blocking combinations of 5 roads at a time). The plots 700 and 702 show the complex interaction between traffic (y-axis) and combinations of attacked roads (x-axis). Thus, as can be appreciated, it is desirable to guard the relevant roads to maintain traffic flow and reduce discontent.

(4.5.4) Example Scenario Four

In one example application, the system invention could be used to predict the effects of traffic on revenue and discontent within the city given a particular event. For example, disruption to one or more specific roads, as discovered by the system, might disrupt traffic and thus revenue generation to/from particular areas of the city and increase citizen discontent, both directly (longer commutes) and indirectly (reduced income).

(4.6) Reduction to Practice

The method described herein was implemented to further illustrate its effectiveness and provide an example application. A variation of Scenario Two (as described above) was used, in which 20 roads needed to be repaired and the present invention was used as a planning tool to select triples of roads that can be repaired without greatly affecting the flow of traffic.

In this application, the input of required data to build the multi-layer model included road data for Los Angeles county (see Literature Reference No. 8) with ~400,000 intersections labeled with location coordinates, along with ~1.1 million road segments linking the segments each having a length and number of lanes. Also included as input was the population data from the 2010 census with shapefiles indicating geographic regions along with the corresponding population counts.

Using the process described above, a full-scale network was constructed from the road data, with nodes representing intersections and road segments linking them. Thereafter, a reduced network was built by merging the set of nodes whose locations are inside the boundaries of a shapefile, associating an accurate population count to each node after the merging is complete. The resultant reduced network in this example has 3361 nodes and 20,384 edges.

The network was further scaled down by applying k-means clustering to the set of node locations (e.g., latitudes and longitudes), merging all nodes in the same cluster. The resultant network in this example has 100 nodes and 530 edges.

In setting the node features, a population and spending rate was then associated to each node. The resultant system is the multi-layer model without flows.

Multi-layer dynamics were then simulated using the process as described above to find the equilibrium flows on the system. This describes the way the multi-layer model functions in a stable state absent any stimulus.

Stimulation was then applied. The process iterated over each individual stimulus, corresponding to removals of pairs of roads from the set of ten roads that need to be repaired. In this example, the system first removed the pair of roads, and then ran the model dynamics until equilibrium or a predefined stopping point was reached. The equilibrium is reached when the maximal change in flow is below a user-specified threshold (10^-5) along any individual edge and in any of the three layers.

The results of each stimulus was then stored at each recorded time-step in a table (or list) that can be queried by the end user in order to find the resultant changes in traffic, revenue and discontent over time. One concern is that the number of possible stimuli may be so large that the above procedure does not finish in a reasonable amount of time. In this case, the system issues a warning to the user that the model will be further scaled down according to the clustering step (i.e., element 314 in FIG. 3) until the running time is sufficiently reduced. The user may specify a maximum or minimum model scale in terms of the number of clusters.

In this example, the end user utilizes a GUI (i.e., element 324 from FIG. 3) to select a road removal, and the GUI queries the dictionary (element 322 from FIG. 3) based on user input to output a visualization and a table (from element 326 of FIG. 3) listing the most highly effected links and their associated changes in flow in response to the selected road removal. A csv file is also sent to the end user, sorted by road removals which have the least affect on traffic flow to those which have the most affect.

Figure 8:
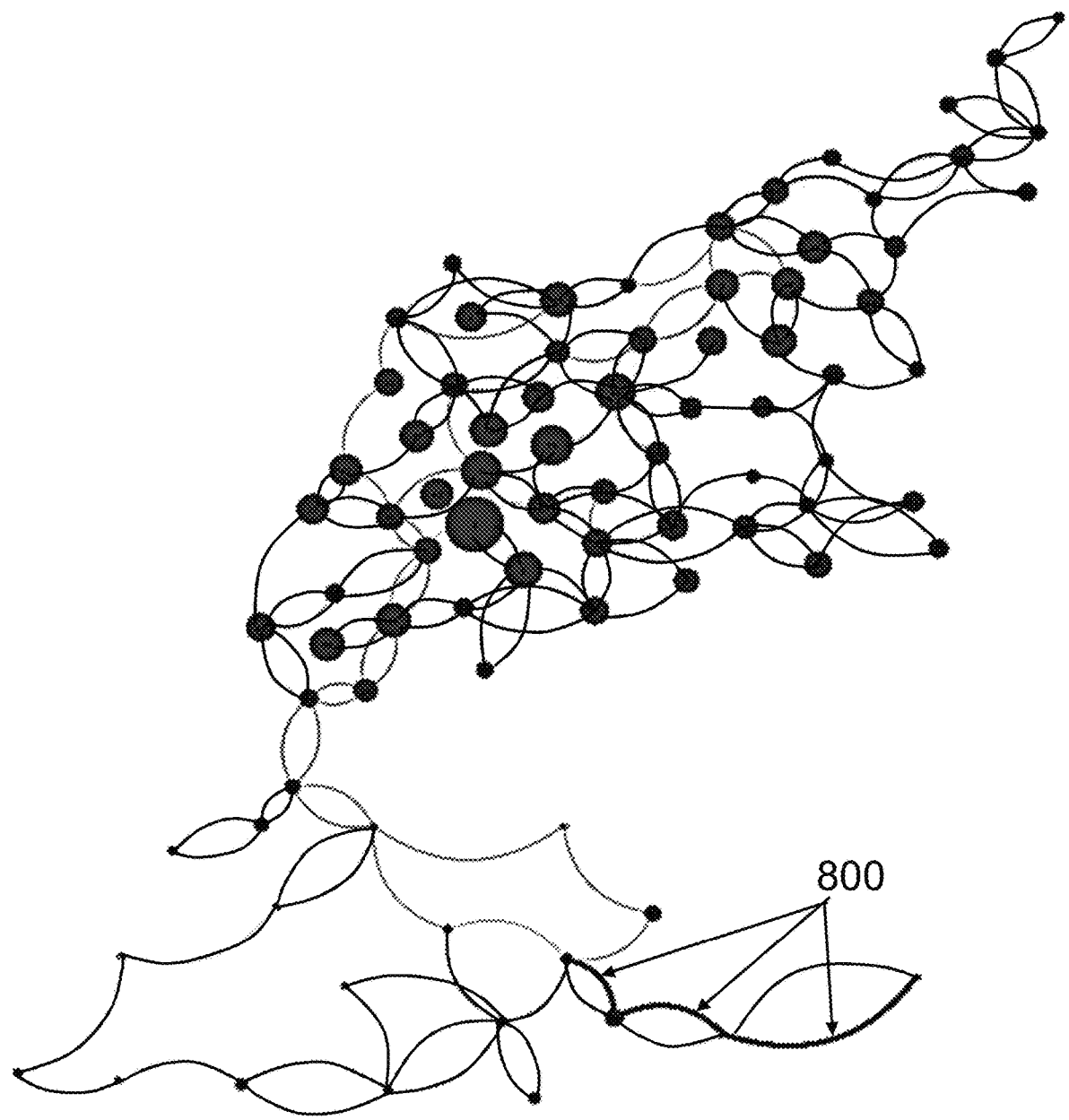
FIG. 8 is an illustration of a best selection of a triple of roads (dark nodes) to minimize time lost due to traffic, where nodes are sized by population and node linking edges are sized according to traffic flow.

For example, FIG. 8 provides an illustration of a best selection of a triple of roads 800 to minimize time lost due to traffic. This is also the worst selection of three roads to minimize discontent, since it reduces revenue flow from a relatively wealthy area. Nodes are sized by population and edges are sized according to traffic flow, with the designated edges being a best triple of roads 800 to minimize time lost due to traffic.

The results are further summarized in FIGS. 9 and 10. Specifically, FIG. 9 is a table depicting the resulting traffic load, time lost, and discontent resulting from the best ten selections of triples of roads from a hand-selection selection of 20 roads. Alternatively, FIG. 10 is a table showing the results of the worst ten selections. Note the disparity between FIGS. 9 and 10, particularly in the average discontent, between the highest and lowest rankings. The numbers in "average traffic load" refer to the average number of vehicles on a given road, but the numbers of average time lost and average discontent are not physical units and hence have only relative significance. That is, since the best choice results in an average time lost of 4107 and the worst choice results in an average time lost of 7518, it is only known that the best choice is nearly twice as good as the worst choice in this respect. As shown in FIG. 7, the best selection of a triple of roads with respect to average time loss is the worst selection of a triple of roads with respect to discontent, which emphasizes the importance of visualization. Specifically, FIG. 7 shows the effects of eliminating a road from the traffic network (e.g., due to some adversarial conditions) and the resulting effects on traffic for two specific roads (220 and 200). The text refers to the fact that the invention allows the user to identify that removing certain roads my not cause that much traffic, but can have a significant negative impact on citizen discontent. A main purpose of FIG. 7 is to illustrate how the invention can be used to determine the effects of removing roads on traffic.

(4.7) Control of a Device

Figure 11:
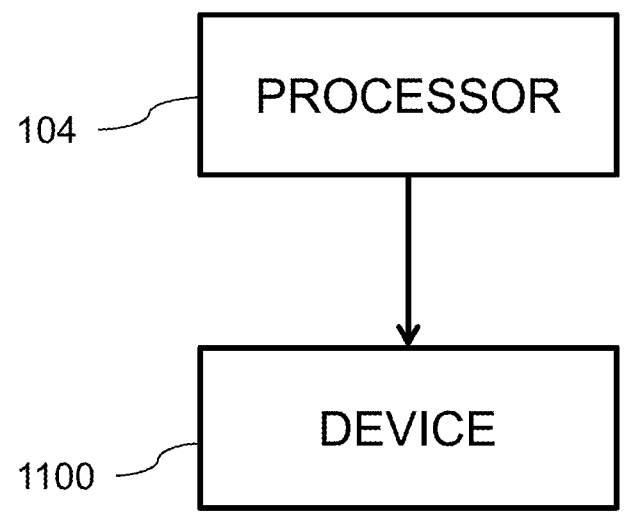
FIG. 11 is a block diagram depicting control of a device according to various embodiments.

As shown in FIG. 11, the system and/or its one or more processors 104 may be used to control a device 1100 (e.g., a mobile device display, a virtual reality display, an augmented reality display, a computer monitor, a motor, a machine, a drone, a camera, etc.) based on the prediction. In some embodiments, the device 1100 may be controlled to cause the device 1100 to move or otherwise initiate a physical action based on the prediction. For example, the system may be implemented within an autonomous vehicle (i.e., the device to be controlled) that is network connected with an external server or otherwise capable of receiving external data. In one example, a prediction can be generated based on a particular stimulus (e.g., protest or blockage of a particular roadway, etc.) with the prediction resulting in a particular traffic pathway having the best traffic flow when the stimulus occurs. If the actual event as related to the stimulus (e.g., a real protest or blockage) occurs in the real-world, the event is received or otherwise input into the vehicle which causes the autonomous vehicle to re-route its travel path to coincide with the predicted traffic pathway having the best traffic flow when the relevant event or stimulus occurs.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A prediction system for simulating effects of a real-world event, the system comprising:
    one or more processors and a memory, the memory being a non-transitory computer-readable medium having executable instructions encoded thereon, such that upon execution of the instructions, the one or more processors perform operations of:
    receiving input data regarding a complex system, the input data having at least a first parameter, a second parameter, and stimuli specifications;
    constructing a full-scale network of the complex system based on the first parameter, such that nodes represent intersecting similarities between components in the first parameter and edges linking the nodes represent distances between nodes;
    generating a reduced network by merging nodes whose locations are within a predefined shape;
    scaling-down the reduced network by clustering the nodes based on location and merging all nodes in a same cluster;
    generating a multi-layer model of the complex system through setting node features by associating the second parameter to each node;
    simulating each layer in the multi-layer model to identify equilibrium flows of the multi-layer model;
    applying stimuli to the multi-layer model to destabilize the multi-layer model, the stimuli reflecting at least one real-world event as associated with the complex system; and
    generating a list of stimuli reflecting a ranking of affected edges between nodes and associated changes in flow in response to each applied stimuli.

2. The prediction system as set forth in claim 1, further comprising an operation of causing a device to implement an action based on occurrence of the real-world event.

3. The prediction system as set forth in claim 2, wherein the action is based on the list of stimuli to cause the device to operate according to edges least affected in response to the stimuli associated with the real-world event.

4. The prediction system as set forth in claim 3, wherein the complex system includes roadways within a city and the first parameter includes road data and the second parameter includes population data.

5. The prediction system as set forth in claim 4, where nodes in the full-scale network represent road intersections and edges between nodes represent road segments linking the road intersections.

6. The prediction system as set forth in claim 5, wherein causing a device to implement an action based on occurrence of the real-world event includes causing an autonomous vehicle to chart and traverse a road path based on road segments and intersections that are least affected by the real-world event.

7. The prediction system as set forth in claim 2, where nodes in the full-scale network represent road intersections and edges between nodes represent road segments linking the road intersections.

8. The prediction system as set forth in claim 7, wherein causing a device to implement an action based on occurrence of the real-world event includes causing an autonomous vehicle to chart and traverse a road path based on road segments and intersections that are least affected by the real-world event.

9. The prediction system as set forth in claim 1, wherein the complex system includes roadways within a city and the first parameter includes road data and the second parameter includes population data.

10. A computer program product on a non-transitory computer-readable medium for simulating effects of a real-world event, the computer program product comprising:
a non-transitory computer-readable medium having executable instructions encoded thereon, such that upon execution of the instructions by one or more processors, the one or more processors perform operations of:
receiving input data regarding a complex system, the input data having at least a first parameter, a second parameter, and stimuli specifications;
constructing a full-scale network of the complex system based on the first parameter, such that nodes represent intersecting similarities between components in the first parameter and edges linking the nodes represent distances between nodes;
generating a reduced network by merging nodes whose locations are within a predefined shape;
scaling-down the reduced network by clustering the nodes based on location and merging all nodes in a same cluster;
generating a multi-layer model of the complex system through setting node features by associating the second parameter to each node;
simulating each layer in the multi-layer model to identify equilibrium flows of the multi-layer model;
applying stimuli to the multi-layer model to destabilize the multi-layer model, the stimuli reflecting at least one real-world event as associated with the complex system; and
generating a list of stimuli reflecting a ranking of effected edges between nodes and associated changes in flow in response to each applied stimuli.

11. The computer program product as set forth in claim 10, further comprising instructions for causing a device to implement an action based on occurrence of the real-world event.

12. The computer program product as set forth in claim 11, wherein the action is based on the list of stimuli to cause the device to operate according to edges least affected in response to the stimuli associated with the real-world event.

13. The computer program product as set forth in claim 12, wherein the complex system includes roadways within a city and the first parameter includes road data and the second parameter includes population data.

14. The computer program product as set forth in claim 13, where nodes in the full-scale network represent road intersections and edges between nodes represent road segments linking the road intersections.

15. The computer program product as set forth in claim 14, wherein causing a device to implement an action based on occurrence of the real-world event includes causing an autonomous vehicle to chart and traverse a road path based on road segments and intersections that are least affected by the real-world event.

16. The computer program product as set forth in claim 11, where nodes in the full-scale network represent road intersections and edges between nodes represent road segments linking the road intersections.

17. The computer program product as set forth in claim 16, wherein causing a device to implement an action based on occurrence of the real-world event includes causing an autonomous vehicle to chart and traverse a road path based on road segments and intersections that are least affected by the real-world event.

18. The computer program product as set forth in claim 10, wherein the complex system includes roadways within a city and the first parameter includes road data and the second parameter includes population data.

19. A computer implemented method for predicting effects of a real-world event, the method comprising an act of:
causing one or more processors to execute instructions encoded on a non-transitory computer-readable medium, such that upon execution, the one or more processors perform operations of:
receiving input data regarding a complex system, the input data having at least a first parameter, a second parameter, and stimuli specifications;
constructing a full-scale network of the complex system based on the first parameter, such that nodes represent intersecting similarities between components in the first parameter and edges linking the nodes represent distances between nodes;
generating a reduced network by merging nodes whose locations are within a predefined shape;
scaling-down the reduced network by clustering the nodes based on location and merging all nodes in a same cluster;
generating a multi-layer model of the complex system through setting node features by associating the second parameter to each node;
simulating each layer in the multi-layer model to identify equilibrium flows of the multi-layer model;
applying stimuli to the multi-layer model to destabilize the multi-layer model, the stimuli reflecting at least one real-world event as associated with the complex system; and generating a list of stimuli reflecting a ranking of effected edges between nodes and associated changes in flow in response to each applied stimuli.

20. The method as set forth in claim 19, further comprising an operation of causing a device to implement an action based on occurrence of the real-world event.

21. The method as set forth in claim 20, wherein the action is based on the list of stimuli to cause the device to operate according to edges least affected in response to the stimuli associated with the real-world event.

22. The method as set forth in claim 21, wherein the complex system includes roadways within a city and the first parameter includes road data and the second parameter includes population data.

23. The method as set forth in claim 22, where nodes in the full-scale network represent road intersections and edges between nodes represent road segments linking the road intersections.

24. The method as set forth in claim 23, wherein causing a device to implement an action based on occurrence of the real-world event includes causing an autonomous vehicle to chart and traverse a road path based on road segments and intersections that are least affected by the real-world event.

25. The method as set forth in claim 20, where nodes in the full-scale network represent road intersections and edges between nodes represent road segments linking the road intersections.

26. The method as set forth in claim 25, wherein causing a device to implement an action based on occurrence of the real-world event includes causing an autonomous vehicle to chart and traverse a road path based on road segments and intersections that are least affected by the real-world event.

27. The method as set forth in claim 19, wherein the complex system includes roadways within a city and the first parameter includes road data and the second parameter includes population data.

\* \* \* \* \*